United States Patent
Kim et al.

(10) Patent No.: US 9,420,722 B2
(45) Date of Patent: Aug. 16, 2016

(54) COMPOSITE HEAT SINK DEVICE FOR COOLING OF MULTIPLE HEAT SOURCES IN CLOSE PROXIMITY

(71) Applicants: Gerald Ho Kim, Carlsbad, CA (US); Jay Eunjae Kim, Issaquah, WA (US)

(72) Inventors: Gerald Ho Kim, Carlsbad, CA (US); Jay Eunjae Kim, Issaquah, WA (US)

( * ) Notice: Subject to any disclaimer, the term of this patent is extended or adjusted under 35 U.S.C. 154(b) by 185 days.

(21) Appl. No.: 14/097,154

(22) Filed: Dec. 4, 2013

(65) Prior Publication Data

US 2014/0160685 A1 Jun. 12, 2014

Related U.S. Application Data

(60) Provisional application No. 61/734,266, filed on Dec. 6, 2012.

(51) Int. Cl.
  *H05K 7/20* (2006.01)
  *H05K 1/18* (2006.01)
  *H05K 3/00* (2006.01)
  *H05K 1/02* (2006.01)

(52) U.S. Cl.
  CPC ............ *H05K 7/2039* (2013.01); *H05K 1/185* (2013.01); *H05K 1/0204* (2013.01); *H05K 3/0061* (2013.01)

(58) Field of Classification Search
  CPC . H01L 23/40; H01L 23/4006; H01L 23/4012; H01L 2023/2018; H01L 2023/4025; H01L 2023/4031; H01L 2023/4037; H01L 2023/4043; H01L 2023/405; H01L 2023/4056; H01L 2023/4062; H01L 2023/4068; H01L 2023/4075; H01L 2023/7081; H01L 2023/4087; H01L 23/4093
  USPC ................. 361/679.54, 709–713, 720–723; 165/80.1–80.3
  See application file for complete search history.

(56) References Cited

U.S. PATENT DOCUMENTS

| | | | | | |
|---|---|---|---|---|---|
| 4,858,069 | A | * | 8/1989 | Hughes | .............. H05K 7/20163 165/104.33 |
| 5,793,611 | A | * | 8/1998 | Nakazato | ............. H05K 1/0201 165/104.33 |
| 5,896,271 | A | * | 4/1999 | Jensen | ................ H01L 23/3677 165/80.3 |
| 7,889,502 | B1 | * | 2/2011 | Reis | ..................... H05K 1/0203 165/80.3 |
| 2004/0173901 | A1 | * | 9/2004 | Mallik | .................... H01L 23/13 257/738 |
| 2006/0096299 | A1 | * | 5/2006 | Mamitsu | ............... H01L 23/473 62/3.2 |
| 2011/0316143 | A1 | * | 12/2011 | Noritake | ............... H01L 21/565 257/713 |
| 2011/0318884 | A1 | * | 12/2011 | Noritake | ............... H01L 21/565 438/122 |
| 2014/0104770 | A1 | * | 4/2014 | Tsai | .......................... G06F 1/20 361/679.4 |
| 2014/0111946 | A1 | * | 4/2014 | Gutermuth | ........... H05K 1/0201 361/720 |

* cited by examiner

*Primary Examiner* — Adam B Dravininkas
(74) *Attorney, Agent, or Firm* — Andy M. Han

(57) ABSTRACT

In one aspect, an apparatus comprises a substrate, a first electrically-driven device disposed on the substrate, a second electrically-driven device disposed on the substrate, and a composite heat sink device. The composite heat sink device comprises a first thermal conduction member, a second thermal conduction member, and a thermal insulation member. The first thermal conduction member is disposed on the first electrically-driven device such that at least a portion of the heat generated by the first electrically-driven device is transferred to the first thermal conduction member by conduction. The second thermal conduction member is disposed on the second electrically-driven device such that at least a portion of the heat generated by the second electrically-driven device is transferred to the second thermal conduction member by conduction. The thermal insulation member is disposed between and thermally decouples the first thermal conduction member and the second thermal conduction member from one another.

1 Claim, 6 Drawing Sheets

COMPOSITE HEAT SINK DEVICE FOR COOLING OF MULTIPLE HEAT SOURCES IN CLOSE PROXIMITY

CROSS REFERENCE TO RELATED PATENT APPLICATION(S)

The present disclosure is a non-provisional application based on and claiming the priority benefit of U.S. patent application Ser. No. 61/734,266, entitled "Composite Heat Sink Device For Cooling Of Multiple Heat Sources In Close Proximity" and filed on 6 Dec. 2012, which is herein incorporated by reference in its entirety.

BACKGROUND

1. Technical Field

The present disclosure generally relates to the field of transfer of thermal energy and, more particularly, to removal of thermal energy from electrically-driven devices that are in close proximity.

2. Description of the Related Art

There are many applications, ranging from consumer electronics to telecommunications and the like, in which electrically-driven devices (e.g., semiconductor-based integrated circuits) capable of performing various tasks are packed in close proximity in a small form factor to serve various needs. Such electrically-driven devices may include, for example, driver circuits, logic processors, graphics processors, laser diodes including edge-emitting lasers and vertical-cavity surface-emitting lasers (VCSELs), light-emitting diodes (LEDs), photodiodes, sensors, etc. Many of such electrically-driven devices inevitably generate thermal energy, or heat, in operation and thus are heat sources when in operation and for a period of time after power off. As the number and complexity of the functionalities performed by such electrically-driven devices continue to increase and as the distance between electrically-driven devices in the small form factor continues to decrease, heat generated by such electrically-driven devices, as heat sources, present technical challenges that need to be addressed.

For one thing, performance, useful lifespan, or both, of an electrically-driven device may be significantly impacted if the heat generated by the device is not adequately dissipated or otherwise removed from the device. Moreover, given the close proximity between two or more electrically-driven devices in some applications, a phenomenon of thermal coupling between the two or more devices may occur and result in the heat generated by one of the devices being transferred to one or more adjacent devices. When thermal coupling occurs, at least a portion of the heat generated by a first electrically-driven devices is transferred to a second electrically-driven device in close proximity due to temperature gradient, such that the temperature of the second electrically-driven device rises to a point higher than it would be when no heat is transferred from the first electrically-driven device to the second electrically-driven device. More specifically, when thermal coupling occurs and when no adequate heat transfer mechanism exists, heat generated by electrically-driven devices in close proximity may detrimentally deteriorate the performance and useful lifespan of some or all of the affected devices.

SUMMARY

Various embodiments disclosed herein pertain to a composite heat sink device that includes at least two thermal conduction members for respectively cooling of at least two electrically-driven devices that are in close proximity. As would be appreciated by those of ordinary skill in the art, the disclosed device, apparatus and techniques, resolve at least some of the aforementioned issues by cooling multiple heat sources (e.g., electrically-driven devices) that are in close proximity with a composite heat sink device having multiple thermal conduction members. The multiple thermal conduction members of the composite heat sink device are thermally decoupled from each other. In addition, the disclosed techniques advantageously reduce the complexity as well as the cost associated with the manufacturing of a cooling package that cools multiple heat sources in close proximity in a small form factor.

According to one aspect, an apparatus may comprise a substrate, a first electrically-driven device, a second electrically-driven device, and a composite heat sink device. The first electrically-driven device may be disposed on the substrate, and may generate heat when in operation. The second electrically-driven device may be disposed on the substrate, and may generate heat when in operation. The composite heat sink device may comprise a first thermal conduction member, a second thermal conduction member, and a thermal insulation member. The first thermal conduction member may be disposed on the first electrically-driven device such that at least a portion of the heat generated by the first electrically-driven device is transferred to the first thermal conduction member by conduction. The second thermal conduction member may be disposed on the second electrically-driven device such that at least a portion of the heat generated by the second electrically-driven device is transferred to the second thermal conduction member by conduction. The thermal insulation member may be disposed between the first thermal conduction member and the second thermal conduction member and may thermally decouple the first thermal conduction member and the second thermal conduction member from one another.

In one embodiment, a thermal conductivity of at least one of the first thermal conduction member or the second thermal conduction member may be 30 W/mK or greater.

In one embodiment, a thermal conductivity of the substrate may be equal to or less than a thermal conductivity of the first thermal conduction member and a thermal conductivity of the second thermal conduction member.

In one embodiment, the thermal insulation member may comprise a thermally insulating material having a thermal conductivity that is at least 25-30 times less than a thermal conductivity of the first thermal conduction member or a thermal conductivity of the second thermal conduction member.

In one embodiment, the thermal insulation member may comprise glass, ceramic, plastic, epoxy, or a combination thereof.

In one embodiment, at least one of the first thermal conduction member or the second thermal conduction member may comprise a metallic material. The metallic material may comprise aluminum, copper, zinc, nickel, iron, an alloy, or a combination thereof.

In one embodiment, at least one of the first thermal conduction member or the second thermal conduction member may comprise a silicon-based material. The silicon-based material may comprise single-crystal silicon.

In one embodiment, at least one of the first thermal conduction member or the second thermal conduction member may comprise a fluid channel therein. The fluid channel may be configured for a fluid to flow in the fluid channel.

In one embodiment, the substrate may comprise a printed circuit board (PCB), a glass substrate, a graphite substrate, a ceramic substrate, or a silicon substrate.

According to another aspect, an apparatus may comprise a substrate, a plurality of electrically-driven devices disposed on the substrate, and a composite heat sink device. Each of the plurality of electrically-driven devices may respectively generate heat when in operation. The composite heat sink device may comprise a plurality of thermal conduction members and a plurality of thermal insulation members. Each of the plurality of thermal conduction members may be disposed on a respective electrically-driven device of the plurality of electrically-driven devices such that at least a portion of the heat generated by each electrically-driven device is transferred to the respective thermal conduction member by conduction. Each of the plurality of thermal insulation members may be disposed between and thermally decoupling respective two adjacent thermal conduction members of the plurality of thermal conduction members from one another.

In one embodiment, a thermal conductivity of at least one of the plurality of thermal conduction members may be 30 W/mK or greater.

In one embodiment, a thermal conductivity of the substrate may be equal to or less than a respective thermal conductivity of each of the plurality of thermal conduction members.

In one embodiment, at least one of the plurality of thermal insulation members may comprise a thermally insulating material having a thermal conductivity that is at least 25-30 times less than a thermal conductivity of at least one of the thermal conduction members.

In one embodiment, at least one of the plurality of thermal insulation members may comprise glass, ceramic, plastic, epoxy, or a combination thereof.

In one embodiment, at least one of the plurality of thermal conduction members may comprise a metallic material. The metallic material may comprise aluminum, copper, zinc, nickel, iron, an alloy, or a combination thereof.

In one embodiment, at least one of the plurality of thermal conduction members may comprise a silicon-based material. The silicon-based material may comprise single-crystal silicon.

In one embodiment, at least one of the plurality of thermal conduction members may comprise a fluid channel therein. The fluid channel may be configured for a fluid to flow in the fluid channel.

In one embodiment, the substrate may comprise a printed circuit board (PCB), a glass substrate, a graphite substrate, a ceramic substrate, or a silicon substrate.

According to one aspect, a composite heat sink device may comprise a first thermal conduction member, a second thermal conduction member, and a thermal insulation member. The first thermal conduction member may be configured to absorb at least a portion of heat generated by a first electrically-driven device by conduction when in contact with the first electrically-driven device. The second thermal conduction member may be configured to absorb at least a portion of heat generated by a second electrically-driven device by conduction when in contact with the second electrically-driven device. The thermal insulation member may be disposed between the first thermal conduction member and the second thermal conduction member and may thermally decouple the first thermal conduction member and the second thermal conduction member from one another.

In one embodiment, the thermal insulation member may comprise a thermally insulating material having a thermal conductivity that is at least 25-30 times less than a thermal conductivity of the first thermal conduction member or a thermal conductivity of the second thermal conduction member.

In one embodiment, the thermal insulation member may comprise glass, ceramic, plastic, epoxy, or a combination thereof.

In one embodiment, at least one of the first thermal conduction member or the second thermal conduction member may comprise a metallic material. The metallic material may comprise aluminum, copper, zinc, nickel, iron, an alloy, or a combination thereof.

In one embodiment, at least one of the first thermal conduction member or the second thermal conduction member may comprise a silicon-based material. The silicon-based material may comprise single-crystal silicon.

In one embodiment, at least one of the first thermal conduction member or the second thermal conduction member may comprise a fluid channel therein, the fluid channel configured for a fluid to flow in the fluid channel.

According to another aspect, an apparatus may comprise a first substrate, a second substrate, a first electrically-driven device, a second electrically-driven device, and a composite heat sink device. The first substrate may have a first primary surface and a second primary surface opposite to the first primary surface of the first substrate. The second substrate may have a first primary surface and a second primary surface opposite to the first primary surface of the second substrate. The first electrically-driven device may be disposed between and in contact with the first primary surface of the first substrate and the first primary surface of the second substrate. The first electrically-driven device may generate heat when in operation. The second electrically-driven device may be disposed between and in contact with the first primary surface of the first substrate and the first primary surface of the second substrate. The second electrically-driven device may generate heat when in operation. The composite heat sink device may comprise a first thermal conduction member and a second thermal conduction member. The first thermal conduction member may be disposed on the second primary surface of the first substrate directly opposite from the first electrically-driven device such that at least a portion of the heat generated by the first electrically-driven device is transferred to the first thermal conduction member through the first substrate by conduction. The second thermal conduction member may be disposed on the second primary surface of the second substrate directly opposite from the second electrically-driven device such that at least a portion of the heat generated by the second electrically-driven device is transferred to the second thermal conduction member through the second substrate by conduction.

In one embodiment, the second substrate may comprise a groove on the first primary surface between a first region of the first primary surface of the second substrate on which the first electrically-driven device is disposed and a second region of the first primary surface of the second substrate on which the second electrically-driven device is disposed.

In one embodiment, the first substrate may comprise an opening between a first region of the first primary surface of the first substrate on which the first electrically-driven device is disposed and a second region of the first primary surface of the first substrate on which the second electrically-driven device is disposed. The opening may communicatively connect the first primary surface of the first substrate and the second primary surface of the first substrate.

In one embodiment, a thermal conductivity of at least one of the first thermal conduction member or the second thermal conduction member may be 30 W/mK or greater.

In one embodiment, a thermal conductivity of the first substrate may be equal to or less than a thermal conductivity of the first thermal conduction member, and a thermal conductivity of the second substrate may be equal to or less than a thermal conductivity of the second thermal conduction member.

In one embodiment, at least one of the first thermal conduction member or the second thermal conduction member may comprise a metallic material. The metallic material may comprise aluminum, copper, zinc, nickel, iron, an alloy, or a combination thereof.

In one embodiment, at least one of the first thermal conduction member or the second thermal conduction member may comprise a silicon-based material. The silicon-based material may comprise single-crystal silicon.

In one embodiment, at least one of the first thermal conduction member or the second thermal conduction member may comprise a fluid channel therein, the fluid channel configured for a fluid to flow in the fluid channel.

In one embodiment, at least one of the first substrate or the second substrate may comprise a printed circuit board (PCB), a glass substrate, a graphite substrate, a ceramic substrate, or a silicon substrate.

The proposed techniques are further described below in the detailed description. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

The present disclosure describes embodiments of a composite heat sink device as well as an apparatus that utilizes the composite heat sink device. The composite heat sink device is used to dissipate, by conduction, heat generated by two or more heat sources that are in close proximity such that a given portion of the composite heat sink device dissipates at least a portion of the heat generated a respective one of the two or more heat sources. For example, the composite heat sink device comprises at least two heat sinks (e.g., thermal conduction members) for the respective cooling of at least two heat sources (e.g., electrically-driven devices) that are in close proximity. Although heat generated, and hence temperature reached, by each of the two or more heat sources is different from that of one or more of the two or more heat sources, there is no path for heat conduction through the composite heat sink device to result in one of the heat sources heating, or heated by, another one of the two or more heat sources through the composite heat sink device.

In one aspect, as shown in FIGS. 1-4, a composite heat sink device in accordance with the present disclosure comprises a first thermal conduction member, a second thermal conduction member, and a thermal insulation member. The first thermal conduction member is configured to absorb at least a portion of heat generated by a first heat source (e.g., a first electrically-driven device such as a driver circuit, a logic processor, a graphics processor, a laser diode, an edge-emitting laser, a VCSEL, an LED, a photodiode, a sensor, for example) by conduction when in contact with the first heat source. The second thermal conduction member is configured to absorb at least a portion of heat generated by a second heat source (e.g., a second electrically-driven device such as a driver circuit, a logic processor, a graphics processor, a laser diode, an edge-emitting laser, a VCSEL, an LED, a photodiode, a sensor, for example) by conduction when in contact with the second heat source. The thermal insulation member is disposed between the first thermal conduction member and the second thermal conduction member so that the thermal insulation member thermally decouples the first thermal conduction member and the second thermal conduction member from one another. That is, heat absorbed by the first thermal conduction member is not transferred to the second thermal conduction member by conduction, and heat absorbed by the second thermal conduction member is not transferred to the first thermal conduction member by conduction. Therefore, there is no path for heat conduction through the composite heat sink device to result in thermal coupling between the first heat source and the second heat source.

Figure 5:
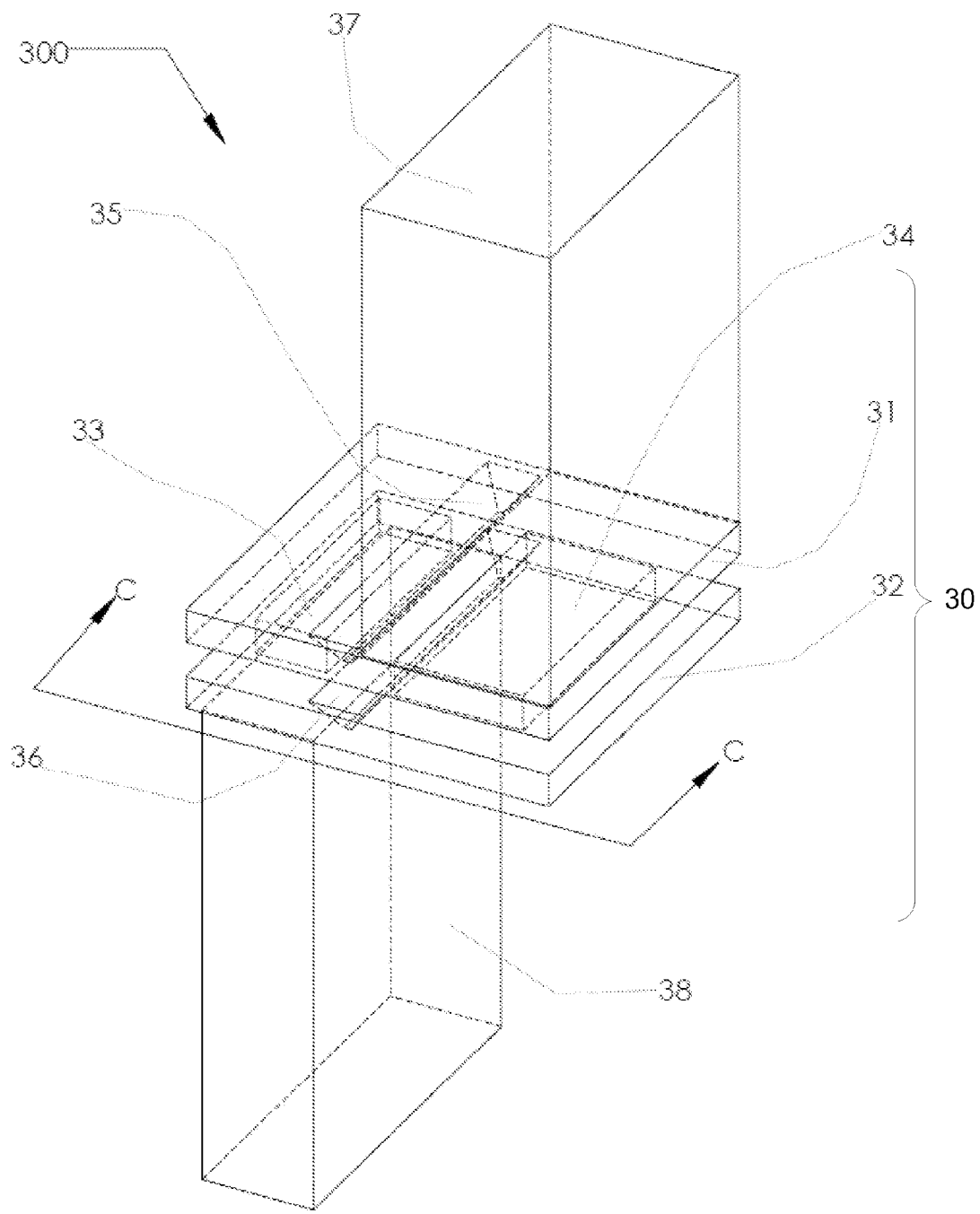
FIG. 5 is a perspective view of an apparatus utilizing a composite heat sink device in accordance with a third embodiment of the present disclosure.
Figure 6:
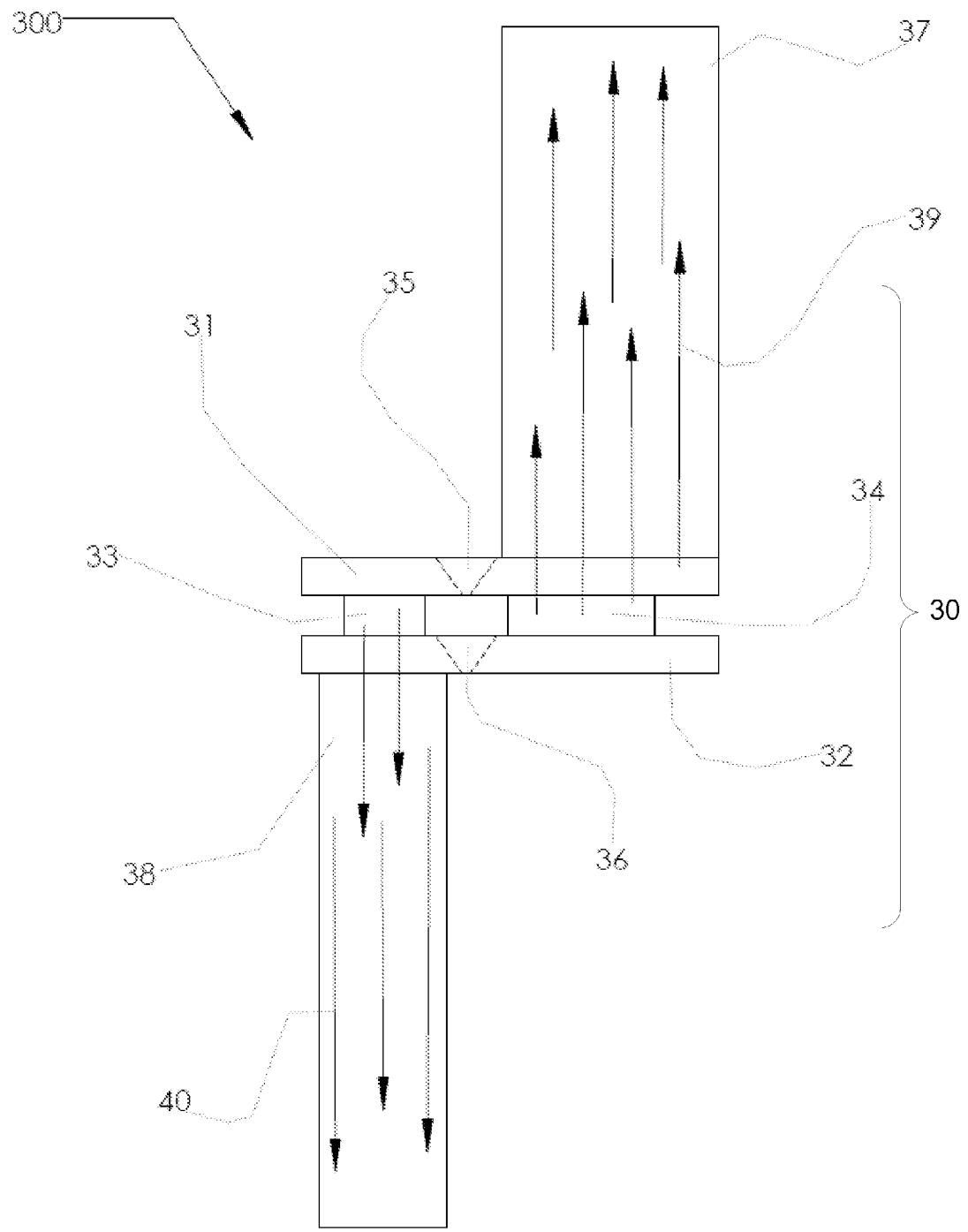
FIG. 6 is a side view of the apparatus of FIG. 5.

In an alternative aspect, as shown in FIGS. 5-6, a composite heat sink device comprises a first thermal conduction member and a second thermal conduction member. The first and second thermal conduction members are disposed on two opposite sides of a package having two heat sources in close proximity therein. The first thermal conduction member is configured to absorb at least a portion of heat generated by a first heat source (e.g., a first electrically-driven device such as a driver circuit, a logic processor, a graphics processor, a laser diode, an edge-emitting laser, a VCSEL, an LED, a photodiode, a sensor, for example) in the package by conduction when in contact with the package at a location near the first heat source. The second thermal conduction member is configured to absorb at least a portion of heat generated by a second heat source (e.g., a second electrically-driven device such as a driver circuit, a logic processor, a graphics processor, a laser diode, an edge-emitting laser, a VCSEL, an LED, a photodiode, a sensor, for example) in the package by conduction when in contact with the package at a location near the second heat source. As the first and second thermal conduction members are on opposite sides of the package, the first and second thermal conduction members are thermally decoupled from each other. That is, heat absorbed by the first thermal conduction member is not transferred to the second thermal conduction member by conduction, and heat absorbed by the second thermal conduction member is not transferred to the first thermal conduction member by conduction. Therefore, there is no path for heat conduction through the composite heat sink device between the first heat source and the second heat source.

While aspects of the disclosed embodiments and techniques may be implemented in any number of different applications, for the purpose of illustration the disclosed embodiments are described in context of the following exemplary configurations.

Illustrative Implementations

Figure 1:
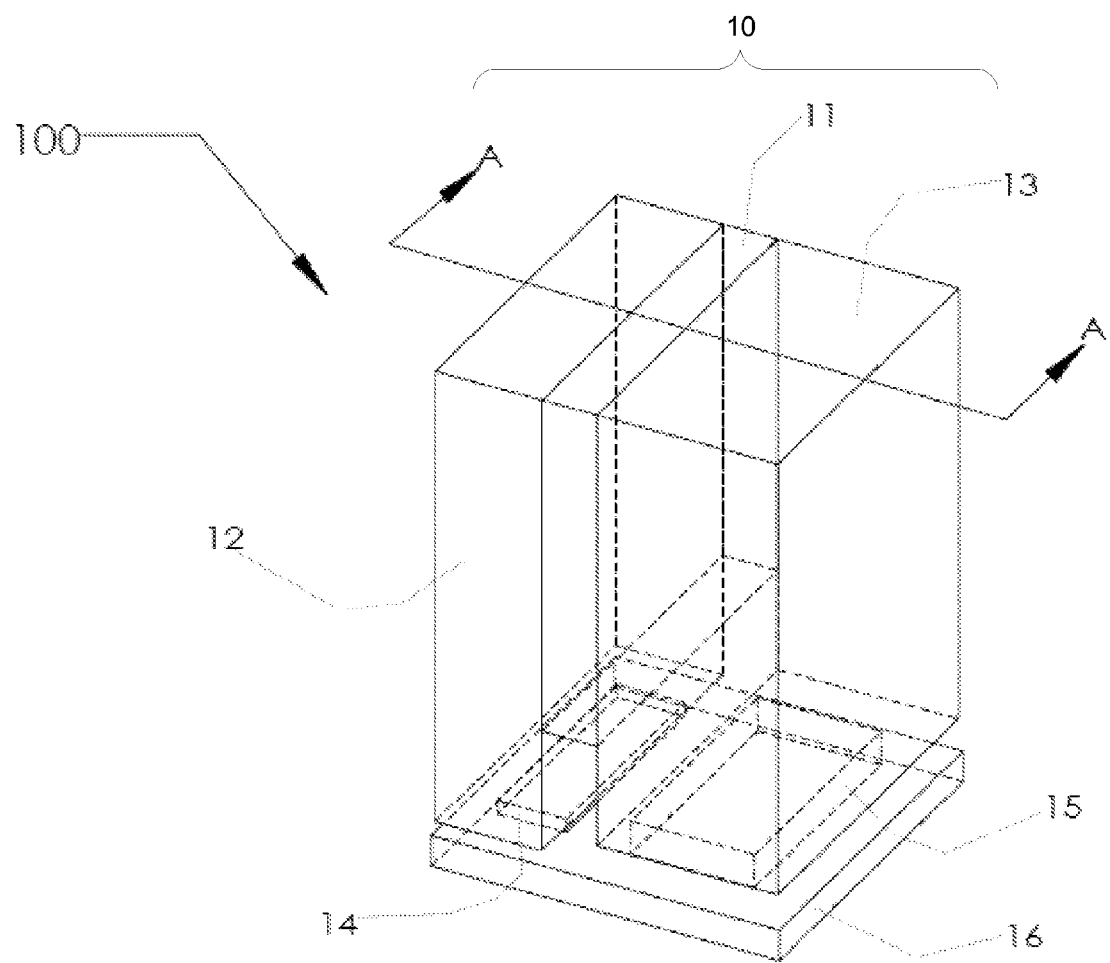
FIG. 1 is a perspective view of an apparatus utilizing a composite heat sink device in accordance with a first embodiment of the present disclosure.
Figure 2:
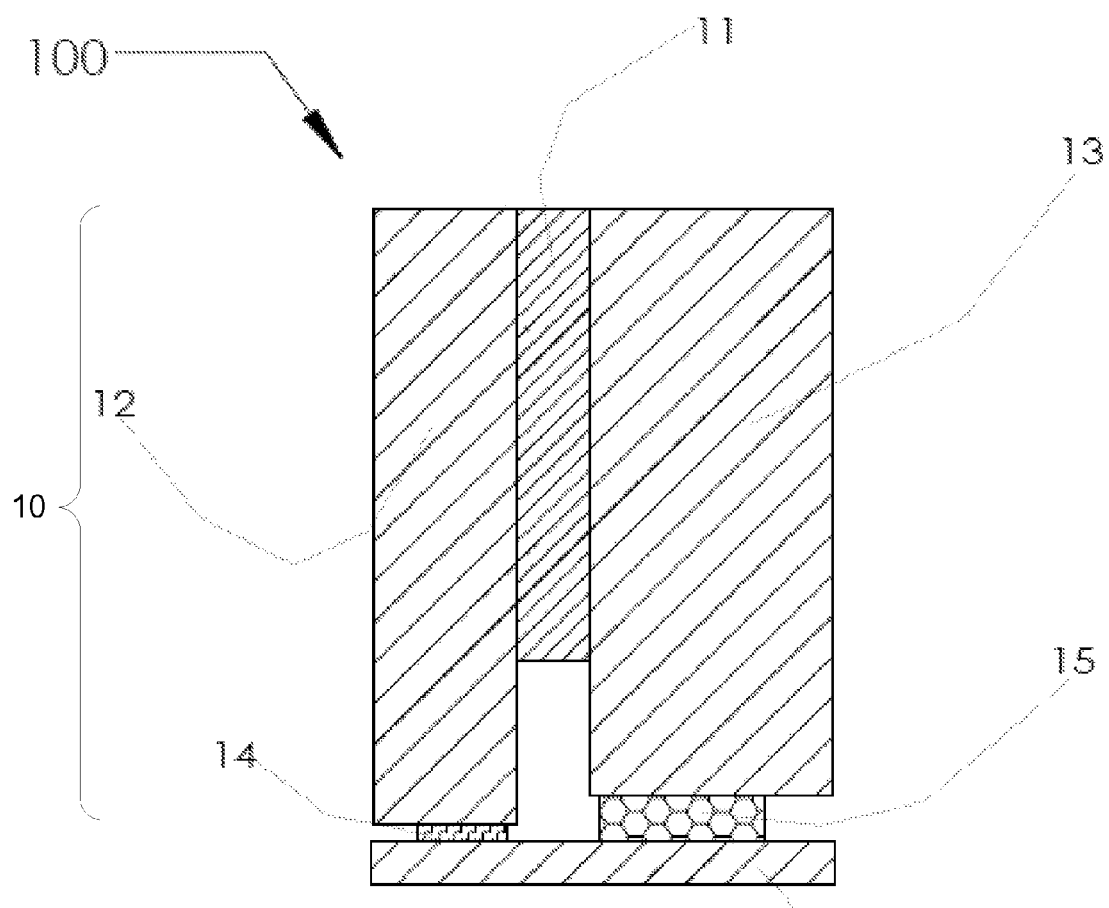
FIG. 2 is a side view of the apparatus of FIG. 1.

FIGS. 1-2 illustrate an apparatus 100 utilizing a composite heat sink device 10 in accordance with an embodiment of the present disclosure.

The apparatus 100 comprises a substrate 16, a first electrically-driven device 14, a second electrically-driven device 15, and a composite heat sink device 10. The substrate 16 may be, for example, a printed circuit board (PCB), a glass substrate, a graphite substrate, a ceramic substrate, or a silicon substrate. The first electrically-driven device 14 is disposed on the substrate 16, and generates heat when in operation. The first electrically-driven device 14 may be, for example, a driver circuit, a logic processor, a graphics processor, a laser diode, an edge-emitting laser, a VCSEL, an LED, a photodiode, a sensor. The second electrically-driven device 15 is disposed on the substrate 16, and generates heat when in operation. The second electrically-driven device 15 may be, for example, a driver circuit, a logic processor, a graphics processor, a laser diode, an edge-emitting laser, a VCSEL, an LED, a photodiode, a sensor. The composite heat sink device 10 comprises a first thermal conduction member 12, a second thermal conduction member 13, and a thermal insulation member 11.

The first thermal conduction member 12 is disposed on the first electrically-driven device 14 such that at least a portion of the heat generated by the first electrically-driven device 14 is transferred to the first thermal conduction member 12 by conduction. The first thermal conduction member 12 may be soldered, epoxied (e.g., by thermally conductive epoxy), glued, injection molded or otherwise affixed on the first electrically-driven device 14. The surface of the first electrically-driven device 14 on which the first thermal conduction member 12 is disposed may be metalized. The second thermal conduction member 13 is disposed on the second electrically-driven device 15 such that at least a portion of the heat generated by the second electrically-driven device 15 is transferred to the second thermal conduction member 13 by conduction. The second thermal conduction member 13 may be soldered, epoxied (e.g., by thermally conductive epoxy), glued, injection molded or otherwise affixed on the second electrically-driven device 15. The surface of the second electrically-driven device 15 on which the second thermal conduction member 13 is disposed may be metalized. Heat absorbed by the first and second thermal conduction members 12, 13 is dissipated to the ambience at least by natural convection or both natural and forced convection. Either or both of the first electrically-driven device 14 and the second electrically-driven device 15 may be soldered, epoxied (e.g., by thermally conductive epoxy), glued, injection molded or otherwise affixed on the substrate 16.

In one embodiment, a thermal conductivity of at least one of the first thermal conduction member 12 or the second thermal conduction member 13 is 30 W/mK or greater.

In one embodiment, a thermal conductivity of the substrate 16 is equal to or less than a thermal conductivity of the first thermal conduction member 12 and a thermal conductivity of the second thermal conduction member 13.

In one embodiment, at least one of the first thermal conduction member 12 or the second thermal conduction member 13 comprises a metallic material. The metallic material may comprise aluminum, copper, zinc, nickel, iron, an alloy, or a combination thereof. For example, at least one of the first thermal conduction member 12 or the second thermal conduction member 13 may be a block of metal.

In one embodiment, at least one of the first thermal conduction member 12 or the second thermal conduction member 13 includes one or more protrusions, such as fins or spikes, which increase the surface area thereof to enhance heat dissipation to the ambience by convection.

In one embodiment, at least one of the first thermal conduction member 12 or the second thermal conduction member 13 comprises a silicon-based material. The silicon-based material may comprise single-crystal silicon.

In one embodiment, at least one of the first thermal conduction member 12 or the second thermal conduction member 13 comprises a fluid channel therein. The fluid channel is configured for a fluid to flow in the fluid channel to allow liquid cooling of the respective thermal conduction member.

The thermal insulation member 11 is disposed between the first thermal conduction member 12 and the second thermal conduction member 13. Thus, the thermal insulation member 11 thermally decouples the first thermal conduction member 12 and the second thermal conduction member 13 from one another.

In one embodiment, the thermal insulation member 11 comprises a thermally insulating material having a thermal conductivity that is at least 25-30 times less than a thermal conductivity of the first thermal conduction member or a thermal conductivity of the second thermal conduction member. For example, while the thermal conductivity of either or both of the first thermal conduction member 12 and the second thermal conduction member 13 may be approximately 30 W/mK, the thermal conductivity of the thermal insulation member 11 may be approximately 1 W/mK. In one embodiment, the thermal insulation member 11 comprises glass, ceramic, plastic, epoxy, or a combination thereof. For example, the thermal insulation member 11 may be FR4. In one embodiment, a thickness of the thermal insulation member 11 is less than or equal to 5 mm. In one embodiment, a thickness of the thermal insulation member 11 is greater than or equal to 0.1 mm.

Figure 3:
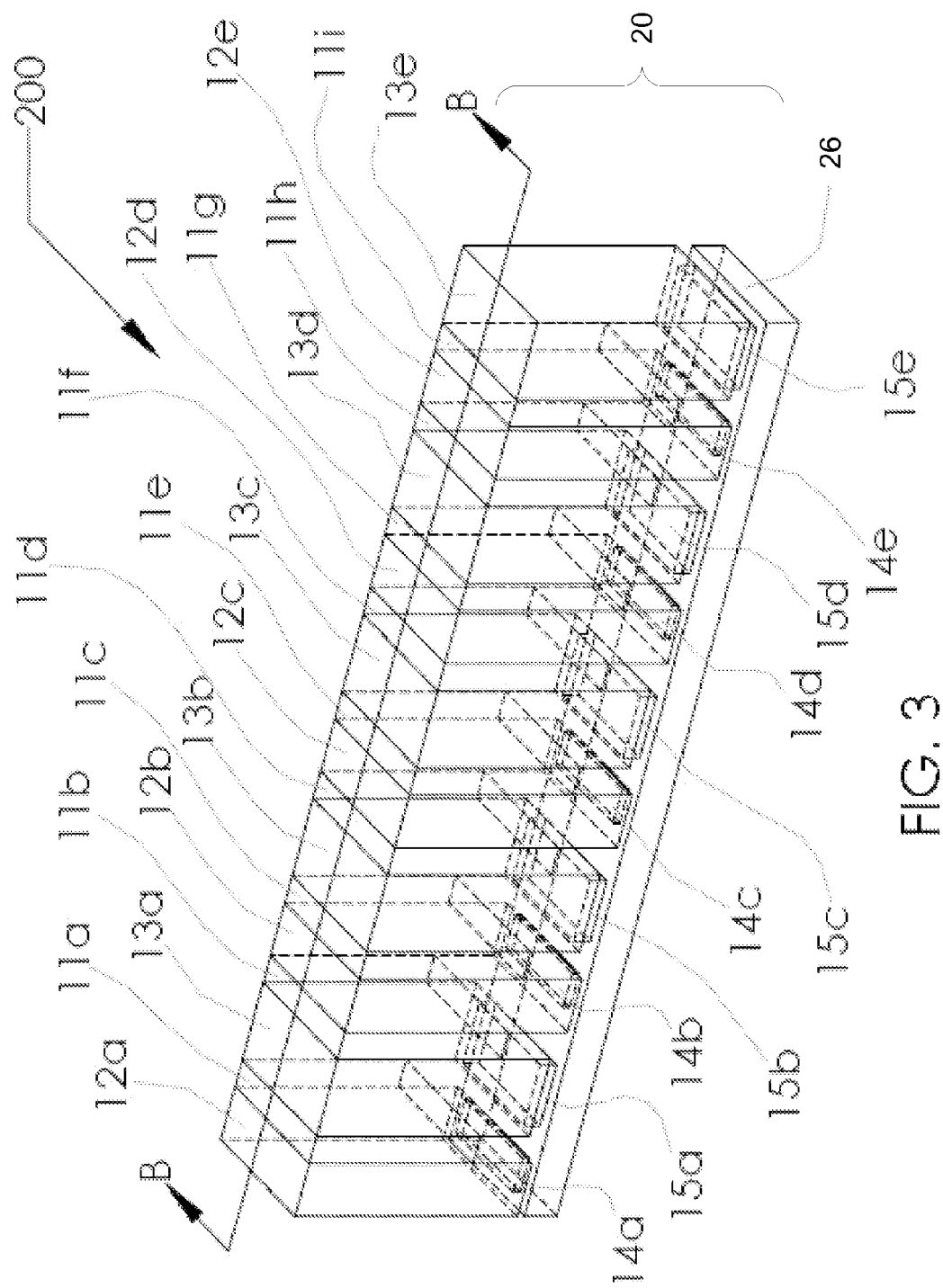
FIG. 3 is a perspective view of an apparatus utilizing a composite heat sink device in accordance with a second embodiment of the present disclosure.
Figure 4:
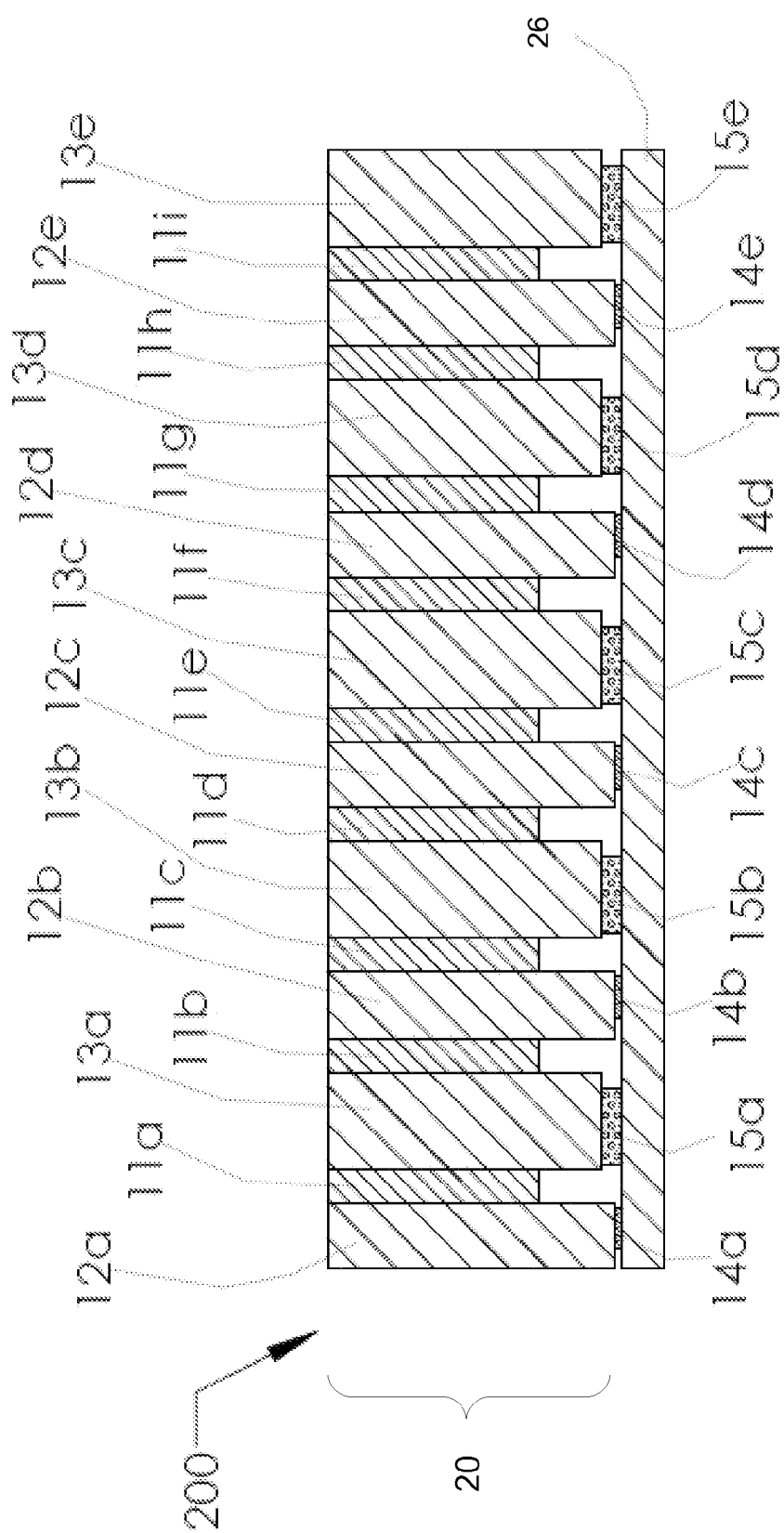
FIG. 4 is a side view of the apparatus of FIG. 3.

FIG. 3 and FIG. 4 illustrate an apparatus 200 utilizing a composite heat sink device 20 in accordance with an embodiment of the present disclosure.

The apparatus 200 comprises a substrate 26, a plurality of electrically-driven devices 14a-14e, 15a-15e disposed on the substrate 26, and a composite heat sink device 20. The substrate 16 may be, for example, a printed circuit board (PCB), a glass substrate, a graphite substrate, a ceramic substrate, or a silicon substrate. Each of the plurality of electrically-driven devices 14a-14e, 15a-15e respectively generates heat when in operation. Each of the plurality of electrically-driven devices 14a-14e, 15a-15e may be, for example, a driver circuit, a logic processor, a graphics processor, a laser diode, an edge-emitting laser, a VCSEL, an LED, a photodiode, a sensor. The composite heat sink device 20 comprises a plurality of thermal conduction members 12a-12e, 13a-13e and a plurality of thermal insulation members 11a-11i. Each of the plurality of thermal conduction members 12a-12e, 13a-13e is disposed on a respective electrically-driven device of the plurality of electrically-driven devices 14a-14e, 15a-15e such that at least a portion of the heat generated by each of the electrically-driven devices 14a-14e, 15a-15e is transferred to the respective thermal conduction member by conduction. Each of the plurality of thermal insulation members 11a-11i is disposed between respective two adjacent ones of the plurality of thermal conduction members 12a-12e, 13a-13e. Thus, each of the plurality of thermal insulation members 11a-11i thermally decouples respective two adjacent ones of the plurality of thermal conduction members 12a-12e, 13a-13e from one another.

Each of the plurality of thermal conduction members 12a-12e, 13a-13e is disposed on a respective one of the plurality of electrically-driven devices 14a-14e, 15a-15e such that at least a portion of the heat generated by each of the plurality of electrically-driven devices 14a-14e, 15a-15e is transferred to the respective one of the plurality of thermal conduction members 12a-12e, 13a-13e by conduction. Each of the plurality of thermal conduction members 12a-12e, 13a-13e may be soldered, epoxied (e.g., by thermally conductive epoxy), glued, injection molded or otherwise affixed on the respective one of the plurality of electrically-driven devices 14a-14e, 15a-15e. The surface of one or more of the plurality of electrically-driven devices 14a-14e, 15a-15e on which the respective one of the plurality of thermal conduction members 12a-12e, 13a-13e is disposed may be metalized. Heat absorbed by the plurality of thermal conduction members 12a-12e, 13a-13e is dissipated to the ambience at least by natural convection or both natural and forced convection. Each of the electrically-driven devices 14a-14e, 15a-15e may be soldered, epoxied (e.g., by thermally conductive epoxy), glued, injection molded or otherwise affixed on the substrate 26.

In one embodiment, a thermal conductivity of at least one of the thermal conduction members 12a-12e, 13a-13e is 30 W/mK or greater.

In one embodiment, a thermal conductivity of the substrate 26 is equal to or less than each of the plurality of thermal conduction members 12a-12e, 13a-13e.

In one embodiment, at least one of the plurality of thermal conduction members 12a-12e, 13a-13e comprises a metallic material. The metallic material may comprise aluminum, copper, zinc, nickel, iron, an alloy, or a combination thereof. For example, at least one of the plurality of thermal conduction members 12a-12e, 13a-13e may be a block of metal.

In one embodiment, at least one of the plurality of thermal conduction members 12a-12e, 13a-13e includes one or more protrusions, such as fins or spikes, which increase the surface area thereof to enhance heat dissipation to the ambience by convection.

In one embodiment, at least one of the plurality of thermal conduction members 12a-12e, 13a-13e comprises a silicon-based material. The silicon-based material may comprise single-crystal silicon.

In one embodiment, at least one of the plurality of thermal conduction members 12a-12e, 13a-13e comprises a fluid channel therein. The fluid channel is configured for a fluid to flow in the fluid channel to allow liquid cooling of the respective thermal conduction member.

In one embodiment, each of the plurality of thermal insulation members 11a-11i comprises a thermally insulating material having a thermal conductivity that is at least 25-30 times less than a thermal conductivity of at least one of the plurality of thermal conduction members 12a-12e, 13a-13e. For example, while the thermal conductivity of at least one of the plurality of thermal conduction members 12a-12e, 13a-13e may be approximately 30 W/mK, the thermal conductivity of each of the plurality of thermal insulation members 11a-11i may be approximately 1 W/mK. In one embodiment, at least one of the plurality of thermal insulation members 11a-11i comprises glass, ceramic, plastic, epoxy, or a combination thereof. For example, at least one of the thermal insulation members 11a-11i may be FR4. In one embodiment, a thickness of at least one of the thermal insulation members 11a-11i is less than or equal to 5 mm. In one embodiment, a thickness of at least one of the thermal insulation members 11a-11i is greater than or equal to 0.1 mm.

FIG. 5 and FIG. 6 illustrate an apparatus 300 utilizing a composite heat sink device 30 in accordance with an embodiment of the present disclosure.

The apparatus 300 comprises a first substrate 31, a second substrate 32, a first heat source or first electrically-driven device 34, a second heat source or second electrically-driven device 33, and a composite heat sink device 30. The first substrate 31 has a first primary surface (e.g., the bottom surface shown in FIGS. 5-6) and a second primary surface (e.g., the top surface shown in FIGS. 5-6) that is opposite to the first primary surface of the first substrate 31. The second substrate 32 has a first primary surface (e.g., the top surface shown in FIGS. 5-6) and a second primary surface (e.g., the bottom surface shown in FIGS. 5-6) that is opposite to the first primary surface of the second substrate 32. The first electrically-driven device 34 is disposed between and in contact with the first primary surface of the first substrate 31 and the first primary surface of the second substrate 32. The first electrically-driven device 34 may be bonded to either or both of the first primary surface of the first substrate 31 and the first primary surface of the second substrate 32 by soldering or thermally conductive epoxy. The first electrically-driven device 34 generates heat when in operation. The second electrically-driven device 33 is disposed between and in contact with the first primary surface of the first substrate 31 and the first primary surface of the second substrate 32. The second electrically-driven device 33 may be bonded to either or both of the first primary surface of the first substrate 31 and the first primary surface of the second substrate 32 by soldering or thermally conductive epoxy. The second electrically-driven device 32 generates heat when in operation. Thus, the first electrically-driven device 34 and the second electrically-driven device 33 are sandwiched between the first substrate 31 and the second substrate 32 and are in close proximity from one another.

The composite heat sink device 30 comprises a first thermal conduction member 37 and a second thermal conduction member 38. The first thermal conduction member 37 is disposed on the second primary surface of the first substrate 31 directly opposite from the first electrically-driven device 34 such that at least a portion of the heat 39 generated by the first electrically-driven device 34 is transferred to the first thermal conduction member 37 through the first substrate 31 by conduction. The second thermal conduction member 38 is disposed on the second primary surface of the second substrate 32 directly opposite from the second electrically-driven device 33 such that at least a portion of the heat 40 generated by the second electrically-driven device 33 is transferred to the second thermal conduction member 38 through the second substrate 32 by conduction.

In one embodiment, the second substrate 32 comprises a groove or opening 36 on the first primary surface between a first region of the first primary surface of the second substrate 32 on which the first electrically-driven device 33 is disposed and a second region of the first primary surface of the second substrate 32 on which the second electrically-driven device 34 is disposed. Additionally or alternatively, in one embodiment, the first substrate 31 comprises a groove or opening 35 on the first primary surface between a first region of the first primary surface of the first substrate 31 on which the first electrically-driven device 33 is disposed and a second region of the first primary surface of the first substrate 31 on which the second electrically-driven device 34 is disposed. The groove or opening 35, 36 aids thermal decoupling of the first electrically-driven device 33 and the second electrically-driven device 34 from one another by increasing a path for heat conduction through the first substrate 31 or the second substrate 32, respectively, between the first electrically-driven device 33 and the second electrically-driven device 34.

In one embodiment, a thermal conductivity of at least one of the first thermal conduction member 37 or the second thermal conduction member 38 is 30 W/mK or greater.

In one embodiment, a thermal conductivity of the first substrate 31 is equal to or less than a thermal conductivity of the first thermal conduction member 37, and a thermal conductivity of the second substrate 32 is equal to or less than a thermal conductivity of the second thermal conduction member 38.

In one embodiment, at least one of the first thermal conduction member 37 or the second thermal conduction member 38 comprises a metallic material. The metallic material may comprise aluminum, copper, zinc, nickel, iron, an alloy, or a combination thereof. For example, at least one of the first thermal conduction member 12 or the second thermal conduction member 13 may be a block of metal.

In one embodiment, at least one of the first thermal conduction member 37 or the second thermal conduction member 38 includes one or more protrusions, such as fins or spikes, which increase the surface area thereof to enhance heat dissipation to the ambience by convection.

In one embodiment, at least one of the first thermal conduction member 37 or the second thermal conduction member 38 comprises a silicon-based material. The silicon-based material may comprise single-crystal silicon.

In one embodiment, at least one of the first thermal conduction member 37 or the second thermal conduction member 38 comprises a fluid channel therein, the fluid channel configured for a fluid to flow in the fluid channel.

In one embodiment, at least one of the first substrate 31 or the second substrate 32 comprises a printed circuit board (PCB), a glass substrate, a graphite substrate, a ceramic substrate, or a silicon substrate.

Additional and Alternative Implementation Notes

The above-described embodiments and techniques pertain to a composite heat sink device and an apparatus utilizing a composite heat sink device. Although the techniques have been described in language specific to certain applications, it is to be understood that the appended claims are not necessarily limited to the specific features or applications described herein. Rather, the specific features and applications are disclosed as example forms of implementing such techniques.

In the above description of example implementations, for purposes of explanation, specific numbers, materials configurations, and other details are set forth in order to better explain the invention, as claimed. However, it will be apparent to one skilled in the art that the claimed invention may be practiced using different details than the example ones described herein. In other instances, well-known features are omitted or simplified to clarify the description of the example implementations.

The described embodiments are intended to be primarily examples. The described embodiments are not meant to limit the scope of the appended claims. Rather, the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

What is claimed is:

1. An apparatus, comprising:
  a first substrate having a first primary surface and a second primary surface opposite to the first primary surface of the first substrate;
  a second substrate having a first primary surface and a second primary surface opposite to the first primary surface of the second substrate;
  a first electrically-driven device disposed between and in contact with the first primary surface of the first substrate and the first primary surface of the second substrate, the first electrically-driven device generating heat when in operation;
  a second electrically-driven device disposed between and in contact with the first primary surface of the first substrate and the first primary surface of the second substrate, the second electrically-driven device generating heat when in operation; and
  a composite heat sink device, comprising:
    a first thermal conduction member disposed on the second primary surface of the first substrate directly opposite from the first electrically-driven device such that at least a portion of the heat generated by the first electrically-driven device is transferred to the first thermal conduction member through the first substrate by conduction; and
    a second thermal conduction member disposed on the second primary surface of the second substrate directly opposite from the second electrically-driven device such that at least a portion of the heat generated by the second electrically-driven device is transferred to the second thermal conduction member through the second substrate by conduction.

* * * * *